United States Patent [19]

Raverdy et al.

[11] 4,437,035

[45] Mar. 13, 1984

[54] PYROELECTRIC TARGET AND IMAGE PICK UP TUBE PROVIDED WITH SUCH A TARGET

[75] Inventors: Claude Y. Raverdy; Serge Veron, both of Paris, France

[73] Assignee: Thomson-CSF, Paris, France

[21] Appl. No.: 311,247

[22] Filed: Oct. 14, 1981

[30] Foreign Application Priority Data

Oct. 14, 1980 [FR] France .................. 80 21943

[51] Int. Cl.³ .................. H01J 31/00; H01J 31/26
[52] U.S. Cl. .................. 313/388; 313/384
[58] Field of Search .............. 313/388, 367, 374, 378, 313/380, 385, 386, 365, 384; 427/68

[56] References Cited

FOREIGN PATENT DOCUMENTS

| | | |
|---|---|---|
| 2922031 | 12/1980 | Fed. Rep. of Germany ...... 313/388 |
| 2400766 | 10/1977 | France . |
| 1523347 | 8/1978 | United Kingdom . |
| 2035685 | 10/1978 | United Kingdom . |

Primary Examiner—David K. Moore
Assistant Examiner—K. Wieder
Attorney, Agent, or Firm—Roland Plottel

[57] ABSTRACT

In order to facilitate the preparation of the reticular pyroelectric target and to improve the mechanical strength thereof, it is provided to connect together the elements of the mosaic, separated by gaps, by means of junction arms small in section with respect to said elements, and rising up to a certain height from the base thereof. These ramifications protect the electric connection between elements provided by the underlying conducting layer, during elaboration thereof; they reinforce the rigidity of the assembly.

5 Claims, 4 Drawing Figures

FIG_1
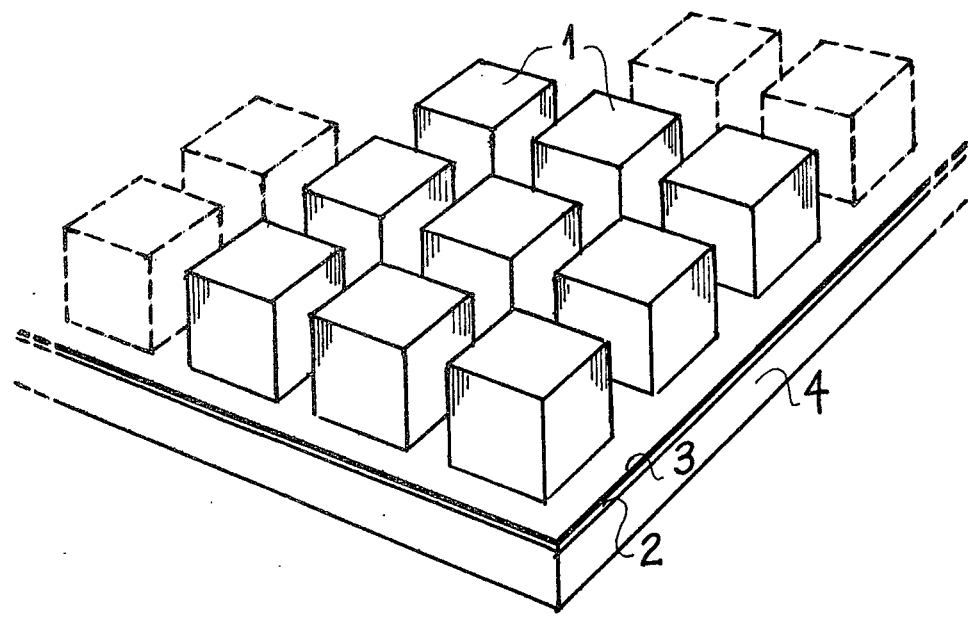
FIG_2
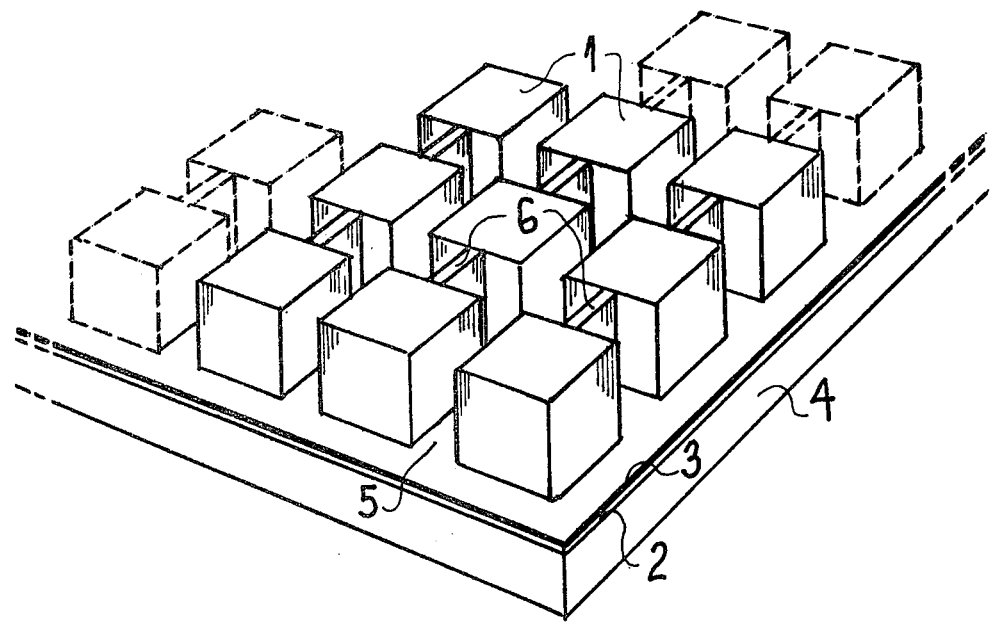

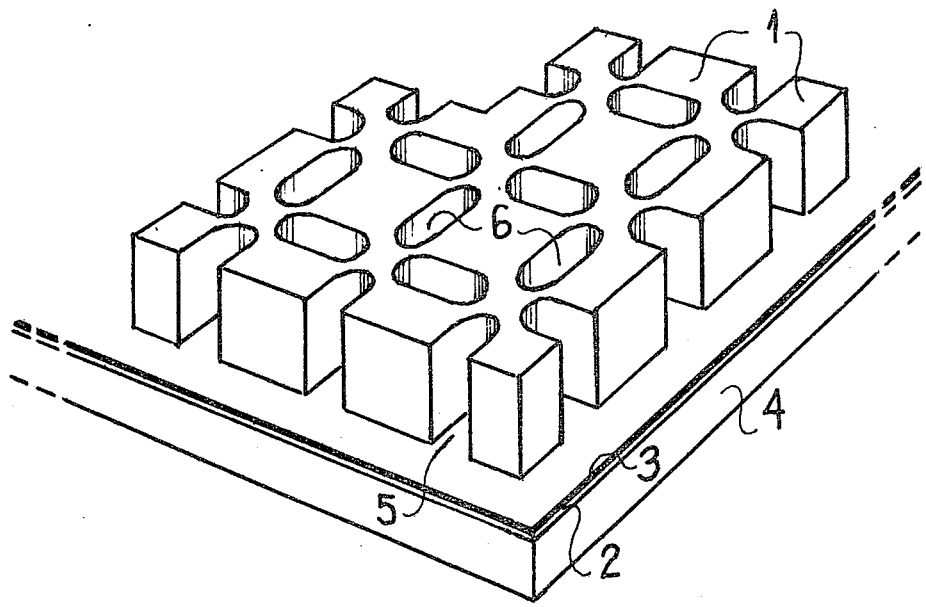
FIG_3
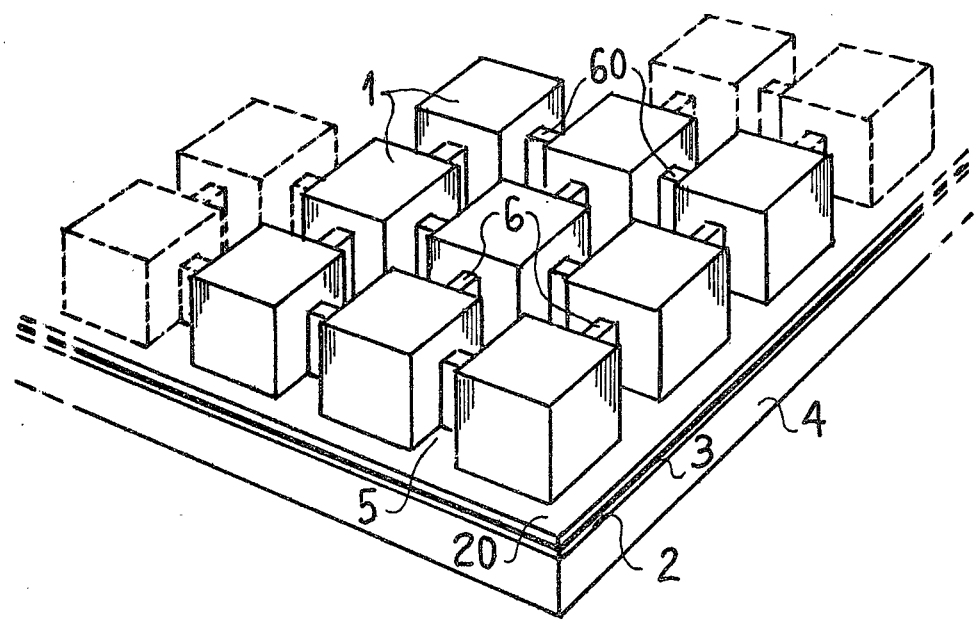
FIG_4

PYROELECTRIC TARGET AND IMAGE PICK UP TUBE PROVIDED WITH SUCH A TARGET

BACKGROUND OF THE INVENTION

The invention relates to a pyroelectric target; such a target is used, more especially, in infra-red radiation image pick up tubes.

It consists of a thin layer of an insulating material having the property of presenting a spontaneous electric polarization which depends on its temperature.

This property is turned to account for obtaining images. The heat radiation from the object falling on the target creates therein a relief of electric charges, which are ready by an electron beam in the manner of a vidicon. An electricity conducting coating is applied to one of the faces of the target for this purpose. It forms the signal plate of the target, from which the electric signals of the points are taken.

The invention also covers the tube in which this reading is carried out.

To increase the power of resolution of such a tube, it has been suggested, in the prior art, to give a reticular appearance to the target. Reference may be made, in this connection, more especially to French Pat. No. 71.17555 (U.S. Pat. No. 2,137,163).

The target consists of a mosaic of small islands made from a pyroelectric material, separated from each other, each of which forms a spot of the target, bonded to a support which is made conducting as has been mentioned. Such a structure improves the resolution of the target because of the obstacle which it puts in the way of lateral heat conductibility between spots, which obstacle means that each one of them is withdrawn from the thermal point of view from the influence of the others.

Such a structure presents a disadvantage.

The small islands, of small size, separated from each other present low adherence to the support. It will be noted in this respect that, once the target is finished, these small islands are, for example, cubes having sides of 30 to 40 micrometers, separated by gaps of about 10 micrometers. According to a currently used method of preparation, they are obtained by etching a wafer of the pyroelectric material, triglycine sulfate TGS for example, of a thickness of about 20 micrometers, after this latter has been bonded to the support, consisting of a sheet of plastic material transparent to the incident radiation and with low heat conductibility, stretched on a metal frame covered with the conducting coating, or signal plate, already mentioned. The thicknesses of the support and of the conducting coating are of a few micrometers and a few hundred angströms respectively. The metal used for the coating being for example gold or chromium. The metal frame is a ring of a diameter of about 20 millimeters.

On the other hand, in order to improve the caracteristics of the target, there is sometimes provided in the prior art another electricity conducting layer, disposed on the bonding layer just below the pyroelectric material; this layer, electrically connected to the preceding coating, avoids the capacity effect of the bonding agent and improves the sensitivity of the target. This arrangement presents another disadvantage.

This second conducting layer, which in practice does not improve the mechanical strength of the small islands, requires on the other hand very high accuracy in the etching of the pyroelectric body if destruction of said layer is to be avoided during such etching and its effect reduced to nothing; this etching must however go as far as this layer if the loss of resolution is to be avoided which the presence of a remnant of pyroelectric material over the whole surface thereof would cause.

This is a second disadvantage.

BRIEF SUMMARY OF THE INVENTION

The invention provides a target in which these disadvantages are avoided. It relates not only to targets having only one electricity conducting layer but also to those having two.

According to the invention, the pyroelectric material islands are connected together by junction ramifications or arms whose section parallel to the plane of the support and, generally, dimensions are small with respect to those of the islands.

The invention provides a pyroelectric taget for an image pick up tube, made from a layer of a material endowed with the property of pyroelectricity, i.e. presenting a spontaneous electric polarization which depends on its temperature, divided into a mosaic of spaced elements bonded at its base to a support covered with an electrode from which is taken, during the reading of the target, the electric signal corresponding to each element and depending on the incident, more especially infra-red, radiation received by the element, characterized in that it comprises junction arms between elements, connecting together at least some thereof, extending over a certain height from their base and presenting dimensions, more especially, a section parallel to this base, which are small with respect to those of the elements themselves.

BRIEF DESCRIPTION OF THE DRAWNGS

The invention will be better understood with reference to the following description and the accompanying figures which show in perspective:

FIG. 1: a pyroelectric target fragment to which the invention applies;

FIGS. 2, 3 and 4: fragments of three variations of the target of the invention.

In these figures, for the sake of clarity, the proportions of the different elements have not been respected.

DESCRIPTION OF THE PREFERRED EMBODIMENTS

In FIG. 1, which represents a portion of a target to which the invention applies, there can be seen small islands, or elements, 1 of a pyroelectric material disposed on a support 4, itself previously coated with an electricity conducting coat 2, transparent to the incident radiation arriving from the bottom of the drawings. The pyroelectric elements 1 are fixed to layer 2 by means of a bonding film 3 (thick line). As has been mentioned, these elements are obtained by etching a wafer of the pyroelectric material of uniform thickness, once this latter is bonded to the support, As can be seen in the figure, these elements are separated from each other without any connection therebetween apart from their common substrate.

In the target of the invention, three variations are shown in FIGS. 2, 3 and 4, these elements are connected together by ramifications spared during the etching operation.

In the variation of FIG. 2, these ramifications consist of straight parallelepipeds connecting elements 1 together in parallel lines separated by gaps 5. These ramifications bear the reference 6; they have the same height as elements 1, which they connect together at the middle thereof, and a section parallel to the plane of the support 4 very substantially less than that of elements 1. In one example, these ramifications have a height of 14 micrometers and a thickness of five micrometers.

These ramifications ensure the protection of the part of underlying conducting layer 2 connecting electrically together the elements during preparation of the target, by etching, as has been mentioned, or by any other process such as ionic bombardment more especially. They improve moreover the mechanical strength of the assembly.

FIG. 3 shows a variation of the invention in which elements 1 are connected by their corners to the neighboring elements. The parts common to elements 1 are designated by the same reference 6 as above.

FIG. 4 shows another variation of the invention for a target having two conducting layers, 2 and 20 in the figure. In this variation the elements are joined together in lines and columns by ramifications 6 and 60; these have moreover a smaller height than the elements themselves which reduces the heat exchange between elements with respect to the variation of FIG. 2, while ensuring the same protection for layer 20 and practically the same mechanical strength.

The invention finds one of its applications in vidicon type tubes in infra-red radiation.

What I claim is:

1. A pyroelectric target for an image pick up tube, made from a layer of a material endowed with the property of pyroelectricity, which presents a spontaneous electric polarization which depends on its temperature, said layer divided into a mosaic of spaced pyroelectric elements bonded at its base to a support covered with an electrode from which is taken, during reading of the target, the electric signal corresponding to each element and depending on the incident, more especially infrared, radiation received by the element, said layer further comprising pyroelectric junction arms between said pyroelectric elements, connecting together at least some thereof, said pyroelectric junction arms extending over a certain height from said base and presenting dimensions, particularly a section parallel to said base, which are small with respect to those of the pyroelectric elements themselves.

2. The target as claimed in claim 1, wherein, with the pyroelectric elements disposed in lines and columns, said pyroelectric junction arms extend between the pyroelectric elements of the same column.

3. The target as claimed in claim 1, wherein, with the pyroelectric elements disposed in lines and columns, said pyroelectric junction arms extend between the pyroelectric elements of the same column and those of the same line.

4. The target as claimed in claim 1, wherein said pyroelectric junction arms extend between the corners of four adjacent pyroelectric elements.

5. The target as claimed in claim 1, wherein there is further provided a second electrode underlying said pyroelectric elements.

* * * * *